(12) United States Patent
Guezelarslan et al.

(10) Patent No.: US 12,282,049 B2
(45) Date of Patent: Apr. 22, 2025

(54) METHOD AND SYSTEM FOR DETECTING AND/OR CLASSIFYING A WANTED SIGNAL

(71) Applicant: Rohde & Schwarz GmbH & Co. KG, Munich (DE)

(72) Inventors: Baris Guezelarslan, Munich (DE); Ulrike Buhl, Munich (DE); Lotte Bierdel, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 1078 days.

(21) Appl. No.: 17/071,734

(22) Filed: Oct. 15, 2020

(65) Prior Publication Data

US 2021/0150286 A1 May 20, 2021

(30) Foreign Application Priority Data

Nov. 20, 2019 (EP) ..................................... 19210386

(51) Int. Cl.
*G01R 29/08* (2006.01)
*G06F 18/2415* (2023.01)
*G06N 3/045* (2023.01)

(52) U.S. Cl.
CPC ..... *G01R 29/0892* (2013.01); *G06F 18/2415* (2023.01); *G06N 3/045* (2023.01)

(58) Field of Classification Search
CPC .. G01R 29/0892; G01R 23/18; G01R 23/163; G06F 18/2415; G06N 3/045
See application file for complete search history.

(56) References Cited

U.S. PATENT DOCUMENTS

| | | | | |
|---|---|---|---|---|
| 2011/0280489 A1* | 11/2011 | Turpin | ................ | G01R 13/0254 |
| | | | | 382/209 |
| 2018/0324595 A1* | 11/2018 | Shima | .................. | H04B 7/0413 |

(Continued)

FOREIGN PATENT DOCUMENTS

| | | | | |
|---|---|---|---|---|
| CN | 105915299 A | * | 8/2016 | ........... H04B 17/373 |
| CN | 109104257 A | * | 12/2018 | ........... H04B 17/327 |

(Continued)

OTHER PUBLICATIONS

Keyvan Ghanbari, "Modeling the variations of reflection coefficient of Earth's lower ionosphere using low frequency radio wave data by artificial neural network", Aug. 1, 2016, ScienceDirect, vol. 58 Issue 3, pp. 326-338 (Year: 2016).*

*Primary Examiner* — Catherine T. Rastovski
*Assistant Examiner* — Yossef Korang-Beheshti
(74) *Attorney, Agent, or Firm* — CHRISTENSEN O'CONNOR JOHNSON KINDNESS PLLC

(57) ABSTRACT

A method for at least one of detecting and classifying a wanted signal in an electromagnetic signal is described. The method includes the following steps: the electromagnetic signal is received; a spectrogram of the electromagnetic signal is determined; at least one correlation parameter, for example a correlation multi-dimensional algebraic object including several correlation parameters, is determined based on the determined spectrogram; the at least one correlation parameter is used as an input for a machine learning module; the wanted signal in the electromagnetic signal is detected and/or classified via the machine learning module based at least partially on the at least one correlation parameter. Further, a signal detection and/or classification system and a computer program are described.

16 Claims, 4 Drawing Sheets

(56) References Cited

U.S. PATENT DOCUMENTS

2019/0190693 A1* 6/2019 Wetzker ................ H04W 24/08
2020/0005030 A1   1/2020 Lee

FOREIGN PATENT DOCUMENTS

| CN | 110161453 A * | 8/2019 | ............... G01S 3/14 |
| DE | 102011052900 A1 | 2/2013 | |
| KR | 20190102147 A | 9/2019 | |
| WO | 2018/170267 A1 | 9/2018 | |

* cited by examiner

METHOD AND SYSTEM FOR DETECTING AND/OR CLASSIFYING A WANTED SIGNAL

FIELD OF THE DISCLOSURE

Embodiments of the present disclosure generally relate to a method for detecting and/or classifying a wanted signal in an electromagnetic signal. Embodiments of the present disclosure further relate to a signal detection and/or classification system as well as to a computer program.

BACKGROUND

In many usual wireless communication applications, a wanted signal is located somewhere in a predetermined frequency range, but the exact frequency of the wanted signal may be unknown. Accordingly, the wanted signal has to be located in the electromagnetic background, e.g. in order to tune a receiver to the specific frequency/frequencies of the wanted signal.

Moreover, other important information on the wanted signal may be unknown, for example the type of modulation of the wanted signal.

Different methods for detecting and/or classifying electromagnetic signals are known in the state of the art. For example, in order to classify the wanted signal, a human operator may perform an extraction of certain properties of the electromagnetic signal by visually analyzing the spectrum of the electromagnetic signal by hand. The extracted properties may then be further analyzed in order to detect and/or classify the wanted signal.

Alternatively, as is for example described in DE 10 2017 129 168 A1, the electromagnetic signal may also be automatically classified by an artificial neural network by analyzing a spectrum of the electromagnetic signal.

However, if there are several signals within a small frequency band and/or if two or more signals collide, i.e. have the same frequency, it has turned out that the methods described above may not be enough to reliably detect and/or classify the wanted signal.

Accordingly, the there is a need for a method for detecting and/or classifying a wanted signal that overcomes the problems of the state of the art explained above.

SUMMARY

Embodiments of the present disclosure provide a method for detecting and/or classifying a wanted signal in an electromagnetic signal. In an embodiment, the method comprises the following steps: The electromagnetic signal is received. A spectrogram of the electromagnetic signal is determined. At least one correlation parameter, for example a correlation multi-dimensional algebraic object comprising several correlation parameters, is determined based on the determined spectrogram. The at least one correlation parameter is used as an input for a machine learning module composed, for example, of one or more circuits. The wanted signal in the electromagnetic signal is detected and/or classified via the machine learning module based at least partially on the at least one correlation parameter.

Therein and in the following, the term "detect the wanted signal" is understood to mean that a signal position regarding time and frequency in the spectrogram is localized.

In other words, a central frequency of the wanted signal and the development of the central frequency over time is determined.

Moreover, the term "classify the wanted signal" is generally understood to mean that (certain) information about the signal is determined that is associated with a certain class of electromagnetic signals. For example, a modulation type of the wanted signal and/or a symbol rate of the wanted signal are determined.

Of course, the electromagnetic signal may comprise several wanted signals. Accordingly, several (i.e. two or more) wanted signals may be detected and/or classified with the method according to the present disclosure.

It was found that the at least one correlation parameter comprises information that enables separating signals even if they have the same frequency. In other words, colliding signals can be separated and/or identified with the method according to the present disclosure.

On the other hand, the method according to the present disclosure also enables to detect signal portions having different frequencies that, however, belong together. This is for example the case if a signal is split up into several different frequencies, i.e. in the case of so-called multi-tone signals.

It has turned out that several different classes of wanted signals are associated with similar correlation parameters. Accordingly, the number of different correlation parameters that the machine learning module has to be trained for is reduced. Thus, smaller machine learning structures can be used, which generally results in an enhanced processing speed for the detection and/or classification.

Moreover, even signal classes that the machine learning module has not been trained for can be detected, if the corresponding signal class is associated with similar correlation parameters as another signal class that the machine learning module has been trained for.

Moreover, the method according to the present disclosure has turned out to be more resistant against noise of all sorts compared to the methods known from the state of the art.

The methods known from the state of the art described above are all based on an analysis (by hand or via a machine learning technique) of the spectrogram.

In contrast thereto, the method according to the present disclosure is based on the finding that the problems encountered in the state of the art can be circumvented by using the additional information comprised in the correlation parameter instead of purely relying on an analysis of the spectrogram.

More precisely, it has turned out that the at least one correlation parameter can be analyzed via machine learning techniques and the wanted signal can be detected and/or classified relatively easily compared to the approaches known from the state of the art discussed above.

Therein and in the following, the term "correlation multi-dimensional algebraic object of n-th order" is understood to be an algebraic object having n indices, wherein the entries each are a correlation parameter comprising correlation information on the electromagnetic signal.

Generally, a correlation multi-dimensional algebraic object comprising several correlation parameters may simplify the detection and/or classification since more information is provided that can be evaluated appropriately or rather used as input for the machine learning module.

According to one aspect of the present disclosure, a time evolution of the spectrogram of the electromagnetic signal is determined. Thus, not only a snapshot of the spectrum of the electromagnetic signal is determined but rather an evolution of the spectrum over time. A diagram showing the evolution of the spectrum over time is also called a "waterfall diagram".

In the following, the term "spectrogram" is understood to comprise both a snapshot of the spectrum of the electromagnetic signal at a particular time and a time evolution of the spectrum. Put differently, a spectrogram may relate to a snapshot of the spectrum at a particular time or to a time evolution of the spectrum.

According to another aspect of the present disclosure, the correlation parameter is a frequency correlation parameter. It has turned out that frequency correlation parameters are particularly suitable for detecting and/or classifying colliding signals, as a pattern corresponding to a wanted signal can be identified relatively easily in the at least one frequency correlation parameter. Moreover, also patterns corresponding to colliding signals can be identified in the at least one frequency correlation parameter easier easily compared to an identification in the spectrogram.

The correlation parameter may be a frequency-to-frequency correlation coefficient, for example a Pearson correlation coefficient. It has turned out that frequency-to-frequency correlation coefficients are particularly insensitive to signal noise and are particularly suitable for separating colliding signals. Hence, a more robust or rather resistant method is ensured.

If the frequency of the electromagnetic signal is treated to be quantized rather than to be continuous (which is a typical approach for a digitized signal), the frequency-to-frequency correlation parameter is an algebraic object of order two, i.e. a matrix, with dimension N×N, wherein N is a natural number.

In some embodiments, if a frequency range of the spectrogram is divided into N frequency bins, there are $N^2$ frequency-to-frequency correlation coefficients, i.e. the corresponding frequency-to-frequency correlation matrix is a N×N matrix.

In a further embodiment of the present disclosure, a correlation multi-dimensional algebraic object of at least third order is determined, preferably of third order. In some embodiments, the correlation multi-dimensional algebraic objects of third order is a tensor of third order. Preferably, two of the three indices of the multi-dimensional algebraic object of third order are associated with frequencies, while the third index is associated with time.

According to another aspect of the present disclosure, entries of the correlation multi-dimensional algebraic object are determined that correspond to frequency-to-frequency correlation coefficients. In some embodiments, entries of the correlation multi-dimensional algebraic object are determined that correspond to frequency-to-frequency correlation coefficients that are associated with a predetermined time span.

An observed frequency range of the electromagnetic signal may be divided into several frequency portions in order to determine the correlation multi-dimensional algebraic object and/or an observed time interval may be divided into several time intervals in order to determine the correlation multi-dimensional algebraic object. Accordingly, the entries of the correlation multi-dimensional algebraic object are associated with certain frequency portions and/or with certain time intervals.

According to another aspect of the present disclosure, the correlation multi-dimensional algebraic object is unfolded, thereby obtaining at least one unfolded correlation multi-dimensional algebraic object, for example wherein the at least one unfolded correlation multi-dimensional algebraic object is used as an input for the machine learning module. Thus, additional information on the wanted signal is provided in form of the unfolded correlation multi-dimensional algebraic object.

When a multi-dimensional algebraic object of n-th order is unfolded with respect to one index, generally speaking, the result is a multi-dimensional algebraic object of (n−1)-th order.

When a multi-dimensional algebraic object of n-th order is unfolded with respect to two indices, generally speaking, the result is a multi-dimensional algebraic object of (n−2)-th order and so on.

Higher order singular values of the correlation multi-dimensional algebraic object may be determined based on the at least one unfolded correlation multi-dimensional algebraic object, wherein the higher order singular values of the correlation multi-dimensional algebraic object are used as an input for the machine learning module. Thus, additional information on the wanted signal is provided in form of the higher order singular values.

According to an aspect of the present disclosure, an image processing technique is applied to the at least one correlation parameter in order to detect and/or classify the wanted signal in the electromagnetic signal. Thus, the wanted signal is detected and/or classified by the image processing technique and/or by an image recognition technique applied to the at least one correlation parameter instead of applying these techniques to the spectrogram. As already described above, this method is capable of detecting and separating colliding signals and is more resilient against noise of all sorts.

It has turned out that several different classes of wanted signals exhibit similar correlation patterns, i.e. the image generated based on the determined correlation coefficients are similar to each other. Accordingly, the number of different correlation patterns that the machine learning module has to be trained for is reduced. Thus, smaller machine learning structures can be used, which generally results in an enhanced processing speed for the detection and/or classification.

Moreover, even signal classes that the machine learning module has not been trained for can be detected, if the corresponding signal class exhibits a similar correlation pattern as another signal class that the machine learning module has been trained for.

In some embodiments, an image is generated based on the at least one correlation parameter and the image processing technique is applied to the generated image. In some embodiments, the generated image is a heat map.

According to another aspect of the present disclosure, an image processing technique is applied to the determined spectrogram in order to detect and/or classify the wanted signal in the electromagnetic signal, and wherein the at least one correlation parameter serves as metadata for the machine learning module. Accordingly, the at least one correlation parameter is determined and used as metadata in order to recover additional information on the wanted signal from the electromagnetic signal. In some embodiments, by using the additional metadata as input for the machine learning module, signal collisions can be detected and the detection and/or classification is made more resilient against electromagnetic noise of all sorts.

In one embodiment of the present disclosure, the machine learning module comprises an artificial neural network that is trained to detect and/or classify the wanted signal in the electromagnetic signal based on the determined spectrogram. In other words, the machine learning module comprises an artificial neural network that is adapted to perform the image processing and/or image recognition techniques described above.

In an embodiment, the artificial neural network is a convolutional neural network (CNN), for example a deep convolutional neural network (DCNN). Such CNNs or DCNNs are particularly suitable for image processing and/or image recognition techniques.

Embodiments of the present disclosure further provide a signal detection and/or classification system. The signal detection and/or classification system comprises a receiver and an analysis circuit or module. The receiver is configured to receive electromagnetic signals. The analysis module is configured to process the electromagnetic signals. The signal detection and/or classification system is configured to perform the method for detecting and/or classifying the wanted signal described above. Regarding the advantages of the signal detection and/or classification system, reference is made to the explanations given above with respect to the method for detecting and/or classifying the wanted signal, which also apply to the signal detection and/or classification system and vice versa.

Embodiments of the present disclosure further provide a computer program, computer instructions, etc. The computer program comprises program code means or computer instructions being adapted to cause a signal detection and/or classification system to perform the method for detecting and/or classifying the wanted signal when the computer program is executed on a central processing unit (particularly a graphical processing unit) of the signal detection and/or classification system. Regarding the advantages of the computer program, reference is made to the explanations given above with respect to the method for detecting and/or classifying the wanted signal, which also hold for the computer program and vice versa.

Therein and in the following, the term "program code means" is understood to comprise machine-readable instructions in compiled and/or uncompiled form being provided in any suitable programming language and/or machine language. Moreover, the term "central processing unit" is understood to comprise all suitable types of machine processing units. In some embodiments, the central processing unit may be established as a graphics processing unit (GPU). GPUs are particularly suitable for performing image processing techniques, as they are specifically designed for this type of applications. Of course, other processors can be employed.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
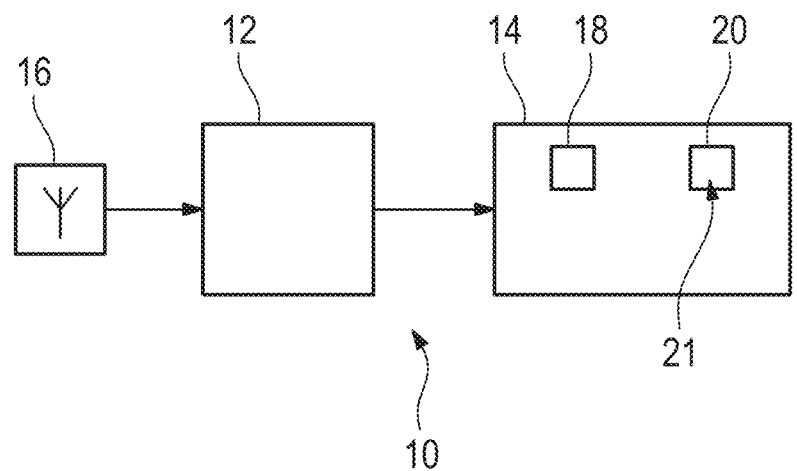
FIG. 1 schematically shows a block diagram of a signal detection and/or classification system according to an embodiment of the present disclosure.

FIG. 1 schematically shows a block diagram of a signal detection and/or classification system 10 that comprises a receiver 12 and an analysis circuit or module 14. Therein and in the following, the term "module" is understood to describe suitable hardware, suitable software, or a combination of hardware and software that is configured to have a certain functionality. The hardware may, inter alia, comprise a CPU, a GPU, an FPGA, an ASIC, or other types of electronic circuitry. The signal detection and/or classification system 10 may be part of a measurement instrument such as an oscilloscope or another type of measurement instruments that is used for signal detection and/or classification.

In the embodiment shown, the receiver 12 comprises a radio frequency (RF) antenna 16. Generally speaking, the receiver 12 or rather the antenna 16 is configured to receive an electromagnetic signal and to forward the received electromagnetic signal to the analysis module 14. The receiver 12 may further be configured to digitize the electromagnetic signal, such that a digitized electromagnetic signal is generated and forwarded to the analysis module 14.

The analysis module 14 comprises a central processing unit (CPU) 18 and a memory 20. Moreover, the term "central processing unit" is understood to comprise all suitable types of machine processing units. In some embodiments, the central processing unit 18 may be established as a graphics processing unit (GPU).

A computer program comprising a machine learning module 21 is stored in the memory 20. The computer program comprises program code means that are adapted to cause the signal detection and/or classification system 10 to perform a method for detecting and/or classifying a wanted signal in the electromagnetic signal described in the following with reference to FIG. 2, when the computer program is executed on the central processing unit 18.

Therein and in the following, the term "program code means" is understood to comprise machine-readable instructions in compiled and/or uncompiled form being provided in any suitable programming language and/or machine language.

More specifically, the machine learning module 21 comprises an artificial neural network that is trained to detect and/or classify the wanted signal in the electromagnetic signal in the way described in the following.

Therein and in the following, the term "detect the wanted signal" is understood to mean that a signal position regarding time and frequency in the spectrogram is localized.

Moreover, the term "classify the wanted signal" is generally understood to mean that certain pieces of information about the signal are determined that are associated with a certain class of electromagnetic signals. For example, a modulation type of the wanted signal and/or a symbol rate of the wanted signal are determined.

In some embodiments, the artificial neural network is established as a convolutional neural network, preferably as a deep convolutional neural network.

First, the electromagnetic signal is received by the antenna 16 and the receiver 12 and is forwarded to the analysis module 14 (step S1).

The analysis module 14 determines a spectrogram of the received electromagnetic signal (step S2). More precisely, a time evolution of the spectrogram is determined.

In the following, the term "spectrogram" is understood to comprise both a "snapshot" of the spectrum of the electromagnetic signal at a particular time and a time evolution of the spectrum. Put differently, the spectrogram may be the spectrum of the electromagnetic signal at a particular time or the time evolution of the spectrum.

Generally speaking, the spectrogram is a function of frequency and time that associates a logarithmic power level of the electromagnetic signal with the respective frequency bin and the respective time bin.

The spectrogram is determined for a predetermined frequency range. More specifically, the spectrogram is determined in a frequency range where the wanted signal is supposed or at least assumed to be.

Figure 3:
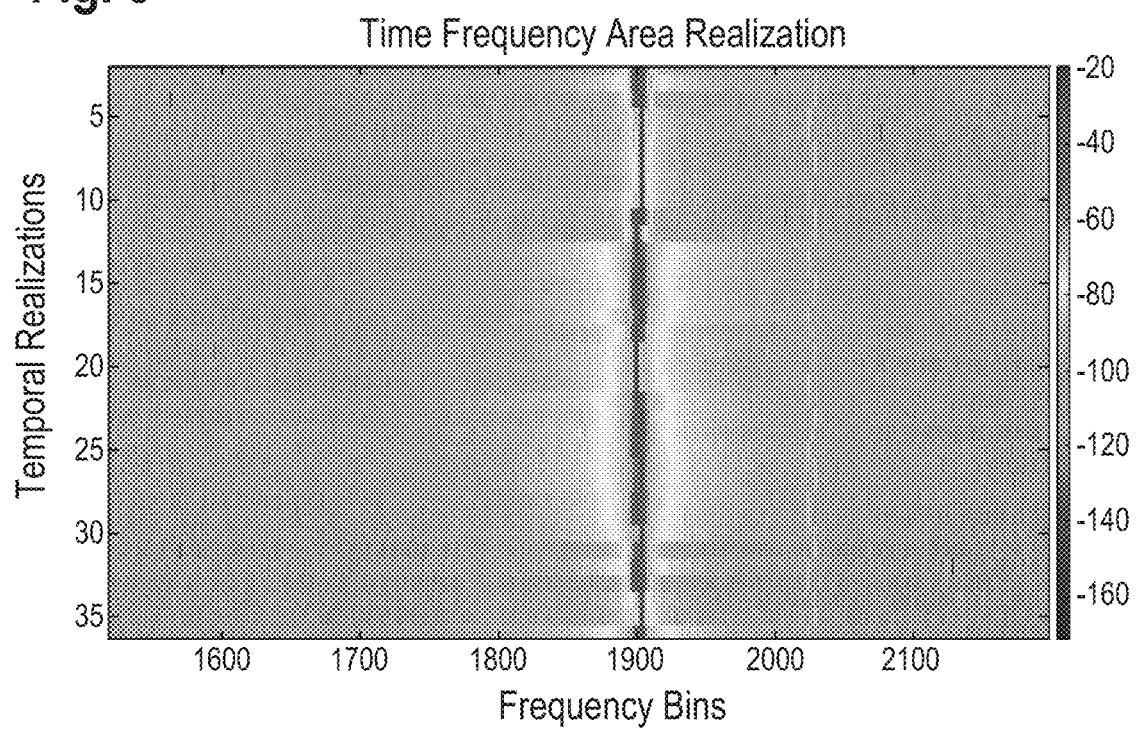
FIG. 3 shows a first spectrogram of a first electromagnetic signal.

The result of step S2 for an exemplary electromagnetic signal is shown in FIG. 3, where the spectrogram is visualized as a heat map, which is also called "waterfall diagram".

In the example of FIG. 3, the spectrogram is shown for frequency bins ranging from 1500 to 2200. Each frequency bin represents a certain frequency range. More precisely, each frequency bin is associated with a certain frequency range having a certain bandwidth in the complex baseband. For example, each frequency bin may have a bandwidth of 30 to 50 Hz, for example of 35 to 45 Hz.

In FIG. 3, the time is plotted on the vertical axis, the frequency is plotted on the horizontal axis and the respective amplitude of the electromagnetic signal is visualized by the color of the respective points in the frequency-time diagram.

In some embodiments, the amplitude is plotted on a logarithmic scale. In the example shown in FIG. 3, the scale is $20 \cdot \log_{10}$ (Amplitude) [dB].

In other words, the spectrogram shows a logarithmic power trend of the (digitized) electromagnetic signal over time, for example over N temporal realizations, and over the predetermined frequency range.

The analysis module 14 then determines at least one correlation parameter or rather a correlation multi-dimensional algebraic objects that comprises several correlation parameters based on the determined spectrogram (step S3).

Some specific examples for the correlation multi-dimensional algebraic object will be given in the following. However, it is to be understood that every other suitable type of correlation parameter could be used as well.

One example for the correlation multi-dimensional algebraic object is a frequency-to-frequency correlation matrix $\rho_{ij} = \rho(A(f_i), A(f_j))$ that is calculated for several, for example all frequency pairs $f_i$, $f_j$ in the predetermined frequency range. Therein, $A(f_i)$ is the amplitude of the electromagnetic signal at frequency $f_i$.

Thus, a correlation multi-dimensional algebraic object of order two is determined, namely the frequency-to-frequency correlation matrix $\rho_{ij}$.

The frequency-to-frequency correlation matrix is calculated according to the following formula:

$$\rho_{ij} = \frac{1}{(N-1)} \sum_{k=1}^{N} \frac{(A_k(f_i) - \mu_{A(f_i)})(A_k(f_j) - \mu_{A(f_j)})}{\sigma_{A(f_i)} \sigma_{A(f_j)}}.$$

Like above, N is the number of temporal realizations. Further, $\mu_A(f_i)$ is the expectation value of the amplitude of the electromagnetic signal at frequency $f_i$ and $\sigma_A(f_i)$ is the variance of the amplitude of the electromagnetic signal at frequency $f_i$.

In other words, a frequency-to-frequency correlation coefficient, more precisely the Pearson correlation coefficient $\rho$ is determined for several, for example for all frequency pairs $f_i$, $f_j$.

Figure 4:
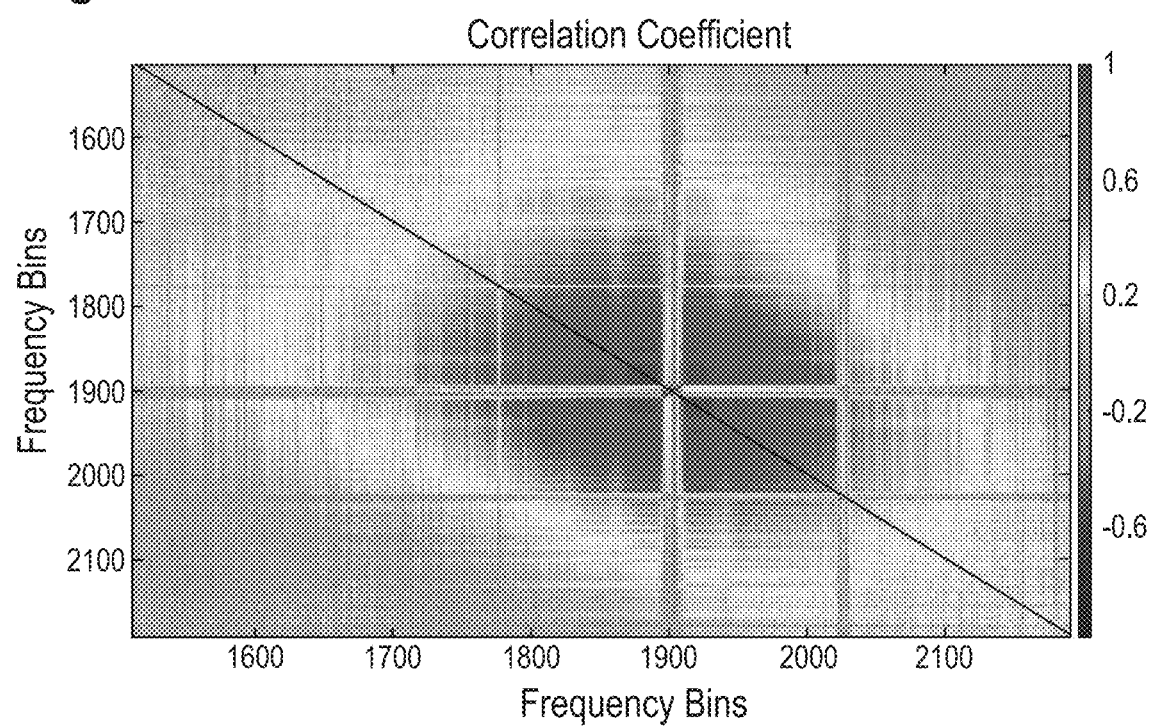
FIG. 4 shows a plot of a frequency-to-frequency correlation parameter of the spectrogram of FIG. 3.

The result of step S3 is shown in FIG. 4, which shows a plot or rather a heat map of the determined frequency-to-frequency correlation matrix. Therein, the frequencies $f_i$ and $f_j$ are plotted on the horizontal and on the vertical axis, respectively. The respective value $\rho_{ij}$ of the correlation coefficient is depicted by the color of the respective point in the diagram.

Generally speaking, the determined correlation multi-dimensional algebraic object is then used as an input for the machine learning module 21 (step S4)

In some embodiments, the determined correlation parameters, i.e. the entries of the determined frequency-to-frequency correlation matrix $\rho_{ij}$ are then used as an input for the machine learning module 21.

Finally, the machine learning module 21, for example the artificial neural network, detects and/or classifies the wanted signal in the electromagnetic signal at least partially based on the determined correlation multi-dimensional algebraic object (step S5).

In the example described above, the artificial neural network detects and/or classifies the wanted signal based on the determined correlation parameters, i.e. based on the determined frequency-to-frequency correlation matrix $p_{ij}$.

Generally speaking, there are two possible variants how the machine learning module 21 or rather the artificial neural network can detect and/or classify the wanted signal in step S5.

According to a first variant of the signal detection and/or classification method, an image is generated based on the determined correlation parameters, for example a heat map of the correlation coefficients. An example for such a heat map is depicted in FIG. 4, as already discussed above.

The machine learning module 21 or rather the artificial neural network then applies image processing and/or image recognition techniques to the generated image in order to detect and/or classify the wanted signal comprised in the electromagnetic signal.

It has turned out that several different classes of wanted signals exhibit similar correlation patterns, i.e. the image generated based on the determined correlation coefficients are similar to each other.

Accordingly, the number of different correlation patterns that the artificial neural network has to be trained for is reduced. Thus, smaller artificial neural networks can be used, which results in an enhanced processing speed for the detection and/or classification according to this variant of the method.

Thus, this method is particularly suitable for detecting the wanted signal or for classifying the wanted signal if a rough classification is sufficient.

Moreover, the correlation parameters and thus also the respective generated image comprise information on signal collisions, i.e. about a superposition of two or more signals in the same frequency band. An example of a spectrogram of an electromagnetic signal comprising a signal collision is shown in FIG. 5.

Such signal collisions usually are not visible in the spectrogram. However, it turned out that such signal collisions can be identified based on the corresponding correlation parameters of the spectrogram as shown in FIG. 6.

Figure 6:
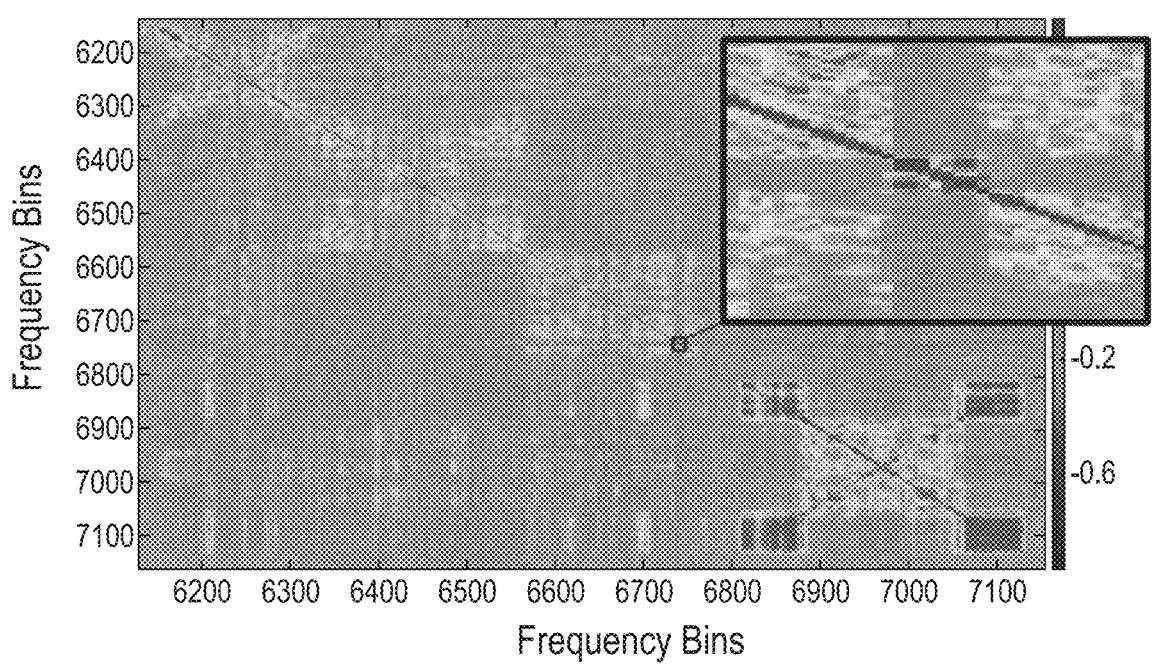
FIG. 6 shows a plot of a frequency-to-frequency correlation parameter of the spectrogram of FIG. 5.

An example for a typical structure corresponding to colliding signals is depicted in the magnified area in FIG. 6.

Figure 5:
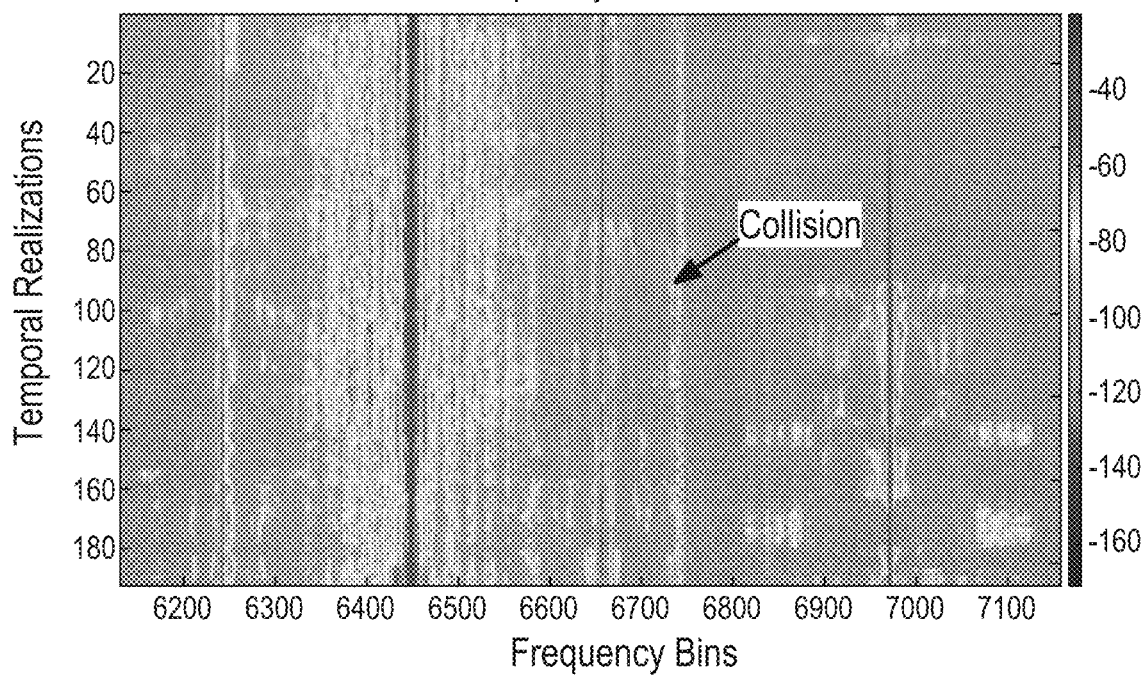
FIG. 5 shows a second spectrogram of a second electromagnetic signal.

According to a second variant of the signal detection and/or classification method, an image is generated based on the determined spectrogram, for example a heat map of the spectrogram like exemplarily shown in FIGS. 3 and 5.

The machine learning module 21 or rather the artificial neural network then applies image processing and/or image recognition techniques to the generated image in order to detect and/or classify the wanted signal comprised in the electromagnetic signal. Additionally, the determined correlation multi-dimensional algebraic object is used as additional metadata for the machine learning module 21, for example for the artificial neural network.

Thus, in this variant, the image processing and/or recognition techniques are applied directly to the spectrogram instead of to the image generated based on the correlation parameters. The determined correlation parameters serve as additional information.

As already explained above, the correlation parameters inter alia comprise information on signal collisions, which might not be resolvable in the spectrogram alone.

However, by combining the image analysis of the spectrogram with the additional information comprised in the correlation parameters, the information on signal collisions comprised in the electromagnetic signal is recovered.

In principal, the correlation parameters described above can be used as metadata.

It turned out that correlation multi-dimensional algebraic objects of third order are particularly suitable for use as metadata.

Figure 7:
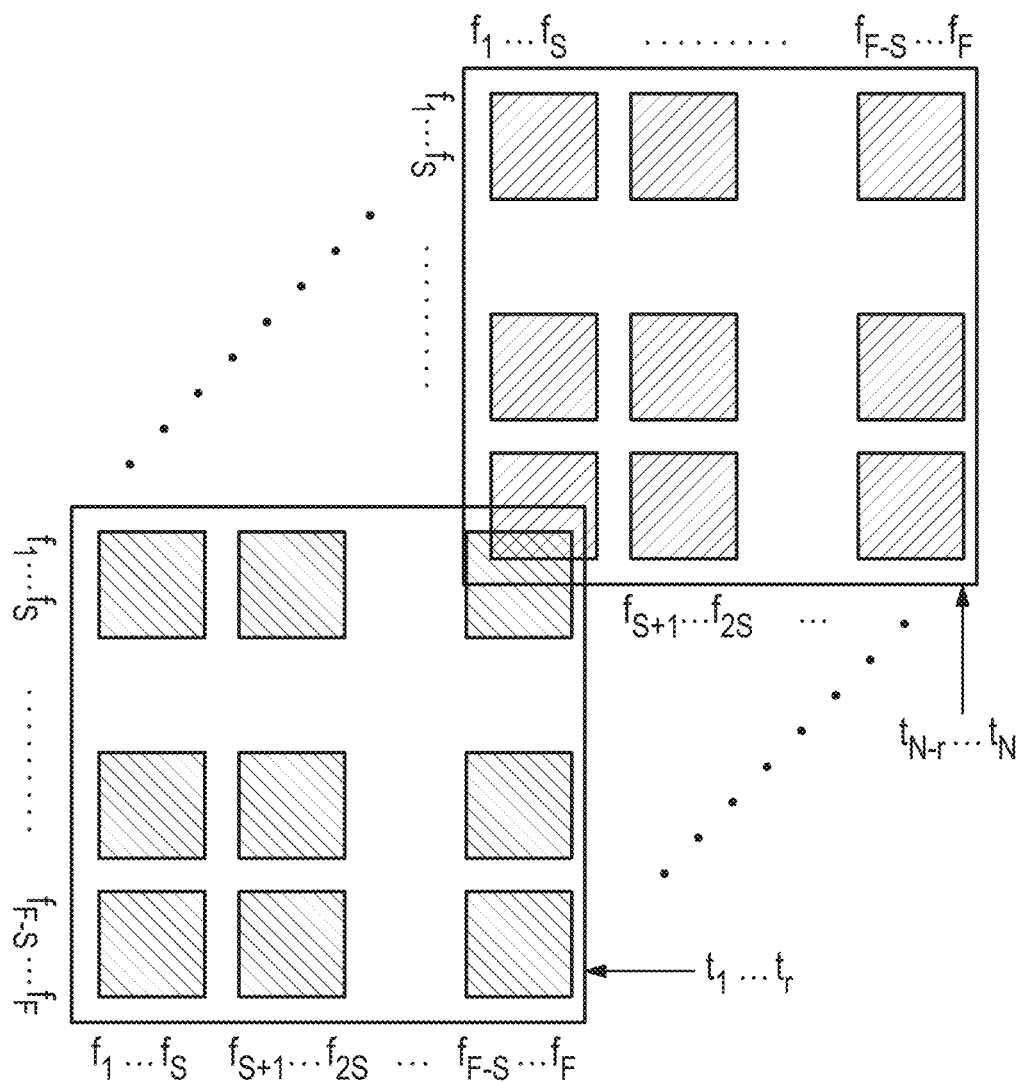
FIG. 7 shows an illustration of a correlation multi-dimensional algebraic object.

An example for such a correlation multi-dimensional algebraic objects of third order is illustrated in FIG. 7. In some embodiments, the correlation multi-dimensional algebraic objects of third order may be a tensor of third order.

Instead of averaging over all N time realizations as in the definition of $\rho_{ij}$ given above, the sum or rather the time average is only performed over r time realizations for each entry of the correlation multi-dimensional algebraic object of third order, wherein r is a natural number. In other words, the N time realizations are divided into several time slices that each contain r time realizations.

Moreover, the predetermined frequency range is divided into several frequency portions that each contain s frequency bins of a total number of F frequency bins, wherein s and F are natural numbers. In other words, each entry of the correlation multi-dimensional algebraic object of third order is associated with s frequency bins. For example, for each entry a sum or an average over the respective s frequency bins is taken.

The resulting correlation multi-dimensional algebraic object of third order $\rho_{i,j,k}$ has three indices, namely indices i and j each indicating the respective frequency portion, and an index k indicating the respective time slice.

For example, the entry "$\rho_{12,3}$" of the correlation multi-dimensional algebraic object of third order is associated with the frequency portions ($f_1 \ldots f_s$) and ($f_{s+1} \ldots f_{2s}$) as well as with the time slice ($t_{2r+1} \ldots t_{3r}$).

The determined correlation multi-dimensional algebraic object of third order may then be used as an input for the machine learning module 21, for example as metadata for the machine learning module 21.

Alternatively, the determined correlation multi-dimensional algebraic object of third order may be unfolded with respect to one of the indices i, j and k. In the unfolding, one dimension of the correlation multi-dimensional algebraic object of third order is kept constant while the other two dimensions are stacked.

More specifically, the indices i and j each run from 1 to F/s, while the index k runs from 1 to N/r.

Accordingly, if the multi-dimensional algebraic object of third order is unfolded with respect to index i, the result is a the multi-dimensional algebraic object of second order, i.e. a matrix, with F/s entries for the first index and with F/s·N/r entries for the second index.

Similarly, if the multi-dimensional algebraic object of third order is unfolded with respect to index j, the result is a the multi-dimensional algebraic object of second order, i.e. a matrix, with F/s·N/r entries for the first index and with F/s entries for the second index.

Finally, if the multi-dimensional algebraic object of third order is unfolded with respect to index k, the result is a the multi-dimensional algebraic object of second order, i.e. a matrix, with $F^2/s^2$ entries for the first index and with N/r entries for the second index.

The unfolded multi-dimensional algebraic object may then be used as an input for the machine learning module, for example as metadata for the machine learning module 21.

Alternatively, a higher order singular values of the correlation multi-dimensional algebraic object are determined based on at least one, for example based on all of the unfolded correlation multi-dimensional algebraic objects described above.

For this purpose, a singular value decomposition may be determined for each of the unfolded correlation multi-dimensional algebraic objects and the correlation multi-dimensional algebraic objects of third order may be multiplied with the respective singular vector of every unfolded correlation multi-dimensional algebraic object.

Then, the higher order singular values may be used as metadata for the machine learning module 21, for example for the artificial neural network.

Figure 2:
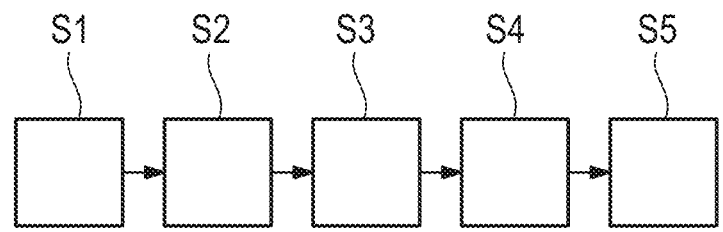
FIG. 2 shows a flow chart of a representative method for detecting and/or classifying a wanted signal according to an embodiment of the present disclosure.

The signal detection and/or classification system 10, including such components as, for example, the analysis module 14, the machine learning module 21, etc., is configured to perform one or more steps schematically shown, for example, in FIG. 2. In some embodiments, one or more of these components includes one or more computer-readable media containing computer readable instructions embodied thereon that, when executed by one or more computer circuits (contained in or associated with the signal detection and/or classification system 10 or components thereof), cause the one or more computer circuits to perform one or more steps of the method of FIG. 2. In some embodiments, the one or more computer circuits includes a microprocessor, a microcontroller, a central processing unit, a graphics processing unit (GPU), a digital signal processor (DSP), etc.

In some embodiments, the one or more computer-readable media contains computer readable instructions embodied thereon that, when executed by the one or more computer circuits, sometimes referred to as computing devices, cause the one or more computer circuits to perform one or more steps of any of the methods of Claims 1-14.

As described briefly above, certain embodiments disclosed herein utilize circuitry (e.g., one or more circuits) in order to implement standards, protocols, methodologies or technologies disclosed herein, operably couple two or more components, generate information, process information, analyze information, store information, display information, generate signals, encode/decode signals, convert signals, transmit and/or receive signals, control other devices, etc. Circuitry of any type can be used. It will be appreciated that the term "information" can be use synonymously with the term "signals" in this paragraph.

In an embodiment, circuitry includes, among other things, one or more computing devices or computer circuits such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

In some examples, the functionality described herein can be implemented by special purpose hardware-based computer systems or circuits, etc., or combinations of special purpose hardware and computer instructions.

Of course, in some embodiments, two or more of the modules, units, etc., described above, or parts thereof, can be integrated or share hardware and/or software, circuitry, etc. In some embodiments, these components, or parts thereof, may be grouped in a single location or distributed over a wide area. In circumstances were the components are distributed, the components are accessible to each other via communication links.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method for at least one of detecting and classifying, by a signal detection and/or classification system of an oscilloscope, a wanted signal in an electromagnetic signal, wherein the signal detection and/or classification system of the oscilloscope comprises a receiver and an analysis circuit, wherein the analysis circuit comprises a machine learning module, the method comprising the steps of:
   receiving, by the receiver of the oscilloscope, the electromagnetic signal;
   determining, by the analysis circuit of the oscilloscope, a spectrogram of the electromagnetic signal;
   determining, by the analysis circuit of the oscilloscope, at least one correlation parameter based on the determined spectrogram, wherein the at least one correlation parameter is a frequency-to-frequency correlation coefficient;
   using said at least one correlation parameter being a frequency-to-frequency correlation coefficient as an input for a machine learning module of the analysis circuit of the oscilloscope; and
   at least one of detecting and classifying, by the machine learning module of the analysis circuit of the oscilloscope, the wanted signal in the electromagnetic signal via the machine learning module based at least partially on the at least one correlation parameter being a frequency-to-frequency correlation coefficient, wherein the frequency-to-frequency correlation coefficient is a Pearson correlation coefficient.

2. The method of claim 1, wherein a correlation multi-dimensional algebraic object comprising several correlation parameters is determined.

3. The method of claim 1, wherein a time evolution of the spectrogram of the electromagnetic signal is determined.

4. The method according to claim 1, wherein a correlation multi-dimensional algebraic object of at least third order is determined.

5. The method according to claim 4, wherein entries of the correlation multi-dimensional algebraic object are determined that correspond to frequency-to-frequency correlation coefficients.

6. The method according to claim 5, wherein at least one of an observed frequency range of the electromagnetic signal is divided into several frequency portions in order to determine the correlation multi-dimensional algebraic object, and an observed time interval is divided into several time intervals in order to determine the correlation multi-dimensional algebraic object.

7. The method according to claim 4, wherein the correlation multi-dimensional algebraic object is unfolded, thereby obtaining at least one unfolded correlation multi-dimensional algebraic object.

8. The method of claim 7, wherein the at least one unfolded correlation multi-dimensional algebraic object is used as an input for the machine learning module.

9. The method according to claim 8, wherein higher order singular values of the correlation multi-dimensional algebraic object are determined based on the at least one unfolded correlation multi-dimensional algebraic object, and wherein the higher order singular values of the correlation multi-dimensional algebraic object are used as an input for the machine learning module.

10. The method according to claim 1, wherein an image processing technique is applied to the at least one correlation parameter in order to at least one of detect and classify the wanted signal in the electromagnetic signal.

11. The method according to claim 1, wherein an image processing technique is applied to the determined spectrogram in order to at least one of detect and classify the wanted signal in the electromagnetic signal, and wherein said at least one correlation parameter serves as metadata for the machine learning module.

12. The method according to claim 1, wherein the machine learning module comprises an artificial neural network that is trained to at least one of detect and classify the wanted signal in the electromagnetic signal based on the determined spectrogram.

13. The method according to claim 12, wherein the artificial neural network is a convolutional neural network.

14. The method according to claim 13, wherein the artificial neural network is a deep convolutional neural network.

15. An oscilloscope comprising a signal detection and/or classification system, the signal detection and/or classification system of the oscilloscope comprising a receiver and an analysis circuit, wherein the receiver is configured to receive electromagnetic signals, wherein the analysis circuit is configured to process the electromagnetic signals, wherein the analysis circuit comprises a machine learning module, and wherein the signal detection and/or classification system is configured to perform method steps comprising:
  receiving, by the receiver of the oscilloscope, the electromagnetic signal;
  determining, by the analysis circuit of the oscilloscope, a spectrogram of the electromagnetic signal;
  determining, by the analysis circuit of the oscilloscope, at least one correlation parameter based on the determined spectrogram, wherein the at least one correlation parameter is a frequency-to-frequency correlation coefficient;
  using said at least one correlation parameter being a frequency-to-frequency correlation coefficient as an input for a machine learning module of the analysis circuit of the oscilloscope; and
  at least one of detecting and classifying, by the machine learning module of the analysis circuit of the oscilloscope, the wanted signal in the electromagnetic signal via the machine learning module based at least partially on the at least one correlation parameter being a frequency-to-frequency correlation coefficient,
  wherein the frequency-to-frequency correlation coefficient is a Pearson correlation coefficient.

16. A non-transitory computer readable medium comprising executable computer instructions adapted to cause an oscilloscope comprising a signal detection and/or classification system to perform a method when the computer instructions are executed on one or more computing devices of the signal detection and/or classification system, the method steps comprising:
  receiving, by a receiver of the signal detection and/or classification system of the oscilloscope, the electromagnetic signal;
  determining, by an analysis circuit of the signal detection and/or classification system of the oscilloscope, a spectrogram of the electromagnetic signal;
  determining, by the analysis circuit of the oscilloscope, at least one correlation parameter based on the determined spectrogram, wherein the at least one correlation parameter is a frequency-to-frequency correlation coefficient;
  using said at least one correlation parameter being a frequency-to-frequency correlation coefficient as an input for a machine learning module of the analysis circuit of the oscilloscope; and
  at least one of detecting and classifying, by the machine learning module of the analysis circuit of the oscilloscope, the wanted signal in the electromagnetic signal via the machine learning module based at least partially on the at least one correlation parameter being a frequency-to-frequency correlation coefficient,
  wherein the frequency-to-frequency correlation coefficient is a Pearson correlation coefficient.

* * * * *